United States Patent [19]

Bunk

[11] Patent Number: 5,572,133
[45] Date of Patent: Nov. 5, 1996

[54] MAGNETIC RESONANCE APPARATUS COMPRISING AN IMPROVED GRADIENT SYSTEM

[75] Inventor: Paul B. Bunk, Eindhoven, Netherlands

[73] Assignee: U.S. Philips Corporation, New York, N.Y.

[21] Appl. No.: 504,088

[22] Filed: Jul. 19, 1995

[30] Foreign Application Priority Data

Jul. 29, 1994 [EP] European Pat. Off. ............. 94202216

[51] Int. Cl.⁶ .................................................. G01V 3/00
[52] U.S. Cl. ............................................ 324/322; 324/318
[58] Field of Search ................................. 324/318, 322, 324/314, 319, 320; 128/653.5

[56] References Cited

U.S. PATENT DOCUMENTS

| | | | |
|---|---|---|---|
| 5,063,349 | 11/1991 | Roemer et al. | 324/318 |
| 5,079,503 | 1/1992 | Siebold et al. | 324/309 |
| 5,245,287 | 9/1993 | Nowak et al. | 324/318 |

FOREIGN PATENT DOCUMENTS 0389666  10/1990  European Pat. Off. ........ G01R 33/38

*Primary Examiner*—Louis M. Arana
*Attorney, Agent, or Firm*—Jack D. Slobod

[57] ABSTRACT

A magnetic measurement apparatus includes a magnet system (1) for generating a steady magnetic field in a measurement space (35), a gradient coil system (3) for generating gradient fields in the measurement space, and a number of gradient amplifiers (9) with input terminals (38) which are connected to means (7) for generating an input signal exhibiting a predetermined variation as a function of time. The output terminals (39) of at least one of the gradient amplifiers (9) are connected to an output circuit which comprises a series connection of a gradient coil (3) and at least one capacitor (55). The output circuit also includes a transformer (41) with a primary winding (43) and a secondary winding (45), the primary winding being connected to the output terminals (39) of the gradient amplifier (9), the secondary winding constituting a series resonant circuit in conjunction with the gradient coil (3) and the capacitor. The current through the gradient coil (3) and the voltage across this coil can thus be substantially higher than the output current and the output voltage of the gradient amplifier (9).

12 Claims, 2 Drawing Sheets

MAGNETIC RESONANCE APPARATUS COMPRISING AN IMPROVED GRADIENT SYSTEM

BACKGROUND OF THE INVENTION

1. Field of the Invention

The invention relates to a magnetic resonance apparatus, including a magnet system for generating a steady magnetic field in a measurement space, a gradient coil system for generating gradient fields in the measurement space, and a number of gradient amplifiers with input terminals which are connected to means for generating an input signal exhibiting a predetermined variation as a function of time, and output terminals, the output terminals of at least one of the gradient amplifiers being connected to an output circuit which comprises a series connection of a gradient coil and at least one capacitor.

2. Description of the Related Art

An apparatus of this kind is known from EP-A-0 389 666 which corresponds to U.S. Patent No. 5, 079,503. The gradient coil in the known apparatus constitutes a series resonant circuit in conjunction with one or two capacitors. The cited document explains that as a result the voltage across the gradient coil may be substantially higher than the output voltage of the gradient amplifier. This is because a boost effect occurs when the resonant circuit operates in resonance, so that the voltage across the gradient coil may become very high. In this situation the gradient amplifier need merely compensate for the voltage loss across the ohmic resistance of the gradient coil. The current through the gradient coil equals the output current of the gradient amplifier.

SUMMARY OF THE INVENTION

It is an object of the invention to provide an apparatus of the kind set forth in which the ratio of the current through the gradient coil and the voltage across this coil can be chosen independently of the output voltage and the output current of the gradient amplifier. This enables comparatively large gradient fields to be generated with very short rise times, without necessitating the use of gradient amplifiers which are capable of delivering extremely high powers and hence are extremely expensive. To this end, the apparatus in accordance with the invention is characterized in that the output circuit also comprises a transformer with a primary winding and a secondary winding, the primary winding being connected to the output terminals of the gradient amplifier whereas the secondary winding constitutes a series resonant circuit in conjunction with the gradient coil and the capacitor. As a result, the current through the gradient coil is determined by the output current of the gradient amplifier, multiplied by the transformation ratio of the transformer. This transformation ratio can be chosen at random within broad limits at no substantial additional costs. Like in the known apparatus, the voltage across the gradient coil is determined mainly by the boost effect in the resonant circuit.

An embodiment of the apparatus in accordance with the invention is characterized in that the gradient coil is composed of substantially identical first and second sub-coils, each of which comprises a first end and a second end, and that the first ends of the first and second sub-coils are interconnected via the secondary winding whereas the second ends of the first and second sub-coils are interconnected via the capacitor. This embodiment offers the advantage that only half of the voltage across the entire gradient coil will be present across each sub-coil. As a result, less severe requirements may be imposed as regards the quality of the insulation of the gradient coil. The capacitor is situated at the electrical center of the gradient coil.

A further embodiment of the apparatus in accordance with the invention is characterized in that a first on/off switch is included in the series resonant circuit. By opening the first on/off switch at an instant at which the current in the resonant circuit equals zero, the current can be maintained at the value zero so that the operation of the gradient coil is abruptly interrupted.

A further embodiment of the apparatus in accordance with the invention is characterized in that a second on/off switch is connected electrically in parallel with the capacitor. By closing the second on/off switch at an instant at which the voltage across the capacitor equals zero, the current through the gradient coil can briefly be maintained at its maximum value.

Another embodiment of the apparatus in accordance with the invention is characterized in that a third on/off switch is electrically connected in series with the primary winding of the transformer and that the output terminals of the gradient amplifier are connected to different ends of the gradient coil via a fourth on/off switch and a fifth on/off switch. By opening the third on/off switch while closing the fourth and fifth on/off switches, the gradient coil can be connected to the output terminals of the gradient amplifier in a conventional manner. The gradient coil is then no longer included in a resonant circuit, so that a series of conventional gradient pulses can be generated. This is because it is desirable for some examinations to operate the gradient coil with conventional pulses and in resonance in rapid succession.

BRIEF DESCRIPTION OF THE DRAWING

These and other aspects of the invention will be described in detail hereinafter with reference to the drawing, wherein.

DETAILED DESCRIPTION OF THE PREFERRED EMBODIMENTS

Figure 1:
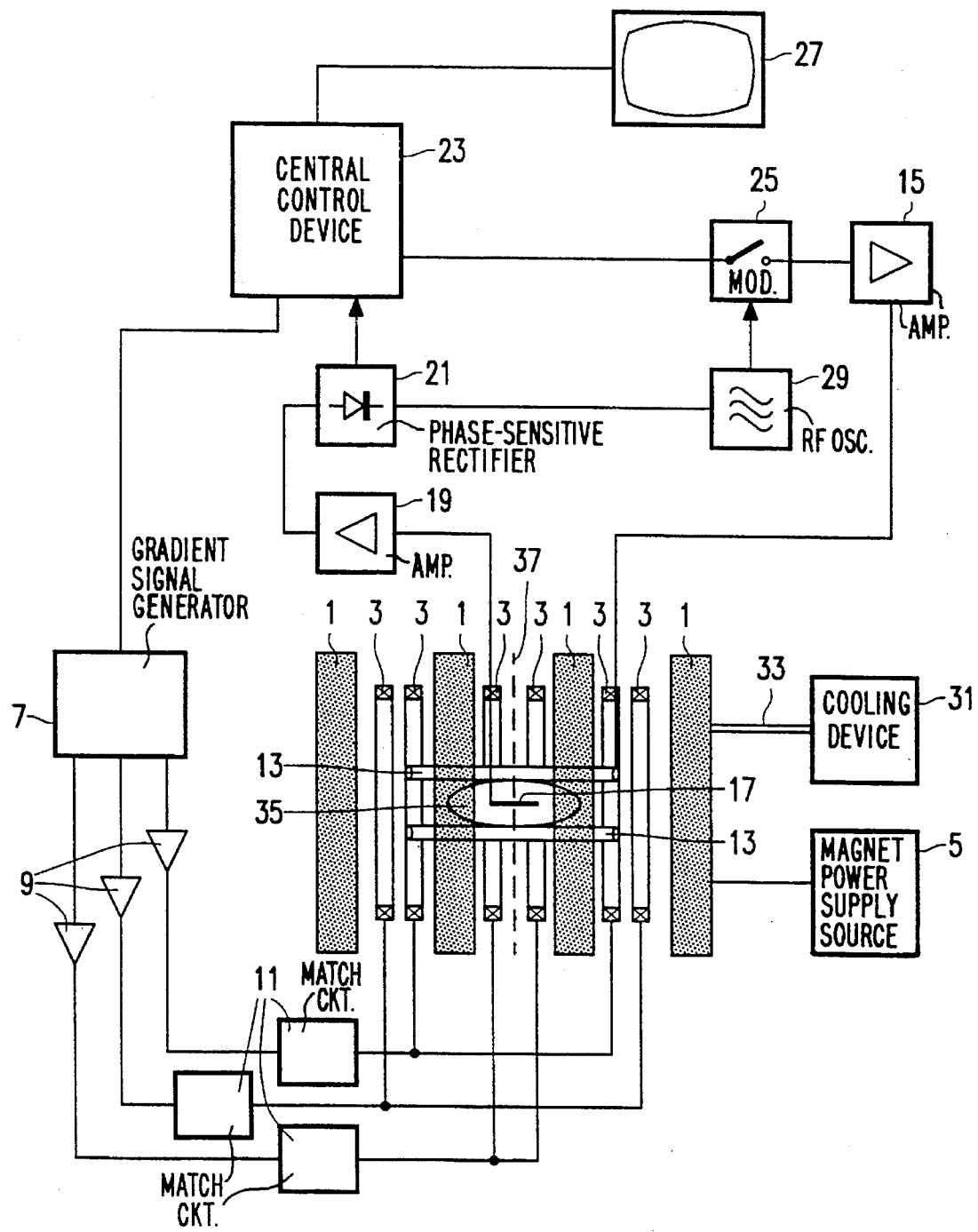
FIG. 1 shows a block diagram of an embodiment of a magnetic resonance apparatus in accordance with the invention.

A magnetic resonance apparatus as shown in FIG. 1 comprises a magnet system 1 for generating a steady, uniform magnetic field, a gradient coil system 3 for generating magnetic gradient fields, and a power supply source 5 for the magnet system. The apparatus also comprises a gradient signal generator 7 and a number of gradient amplifiers 9, i.e. three in the present example. Each gradient amplifier 9 is connected to an output circuit which comprises, in addition to one of the gradient coils 3, a matching circuit 11 which will be described in detail hereinafter with reference to the FIGS. 2 to 4. A magnet coil 13 which serves to generate an RF magnetic alternating field is connected to an RF source of the output of power amplifier 15. A surface coil 17 is shown for detection of magnetic resonance signals generated by the RF transmitted field in an object to be examined. For reading out the coil 17 is connected to a signal amplifier 19. The signal amplifier 19 is connected to a phase-sensitive rectifier 21 which is connected to a central control device 23. The central control device 23 also controls a modulator 25 feeding amplifier 15, the gradient signal generator 7 and a monitor 27 for display. An RF oscillator 29 controls the modulator 25 as well as the phase-sensitive rectifier 21 which processes measurement signals. For cooling, if any, there is provided a cooling device 31 which comprises cooling ducts 33. The transmitter coil 13, arranged within the magnet systems 1 and 3, generates an RF field in a measurement space 35 which offers enough space to accommodate a patient in the case of an apparatus for medical diagnostic measurements. A steady magnetic field, gradient fields for position selection of slices to be imaged, and a spatially uniform RF alternating field can thus be generated in the measurement space 35.

The gradient coil system 3 is customarily arranged symmetrically relative to a radial symmetry plane 37 which, therefore, also symmetrically divides the measurement space 35 into two parts and is oriented through the point Z=0 transversely of the Z axis (not shown) of the steady magnet system 1. The steady magnetic field generated by the steady magnet system 1 is thus oriented along the Z axis. A gradient coil system 3 in a magnetic resonance apparatus usually comprises, for each of the coordinate directions X, Y and Z, a coil system whose activation produces gradient fields in each of these directions so that a pixel-by-pixel image of an object can be formed. The coil systems for the X and Y gradients are usually substantially identical, but rotated through 90° in an azimuthal sense. Each of the three coil systems for the X, Y and Z gradients comprises gradient coils which, together with one of the three matching circuits 11, form part of an output circuit which is connected, via one of the three gradient amplifiers 9, to a separate output of the gradient signal generator 7 which is arranged to generate a suitable signal for each of the three coil systems. As will be described in detail hereinafter, at least one of the matching circuits 11 comprises parts which constitute a series resonant circuit in conjunction with the associated gradient coil 3.

Figure 2:
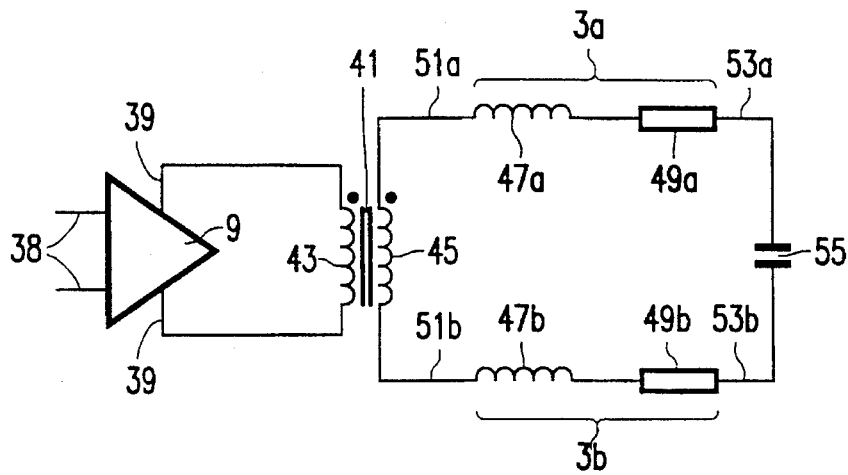
FIG. 2 shows a first embodiment of a circuit for feeding a gradient coil, which embodiment is suitable for use in the apparatus shown in FIG. 1.

FIG. 2 shows a gradient amplifier 9 with input terminals 38 which are connected to the gradient signal generator 7 shown in FIG. 1 and output terminals 39 whereto a first embodiment of an output circuit is connected. The output circuit comprises a transformer 41 with a primary winding 43 and a secondary winding 45. The primary winding 43 is connected to the output terminals 39 of the gradient amplifier 9. The gradient coil 3 of the present embodiment is subdivided into a first sub-coil 3a and a second sub-coil 3b, said sub-coils being substantially identical. As a result, the voltage across each sub-coil 3a, 3b amounts to only half the voltage across the whole gradient coil 3, so that less severe requirements are imposed as regards the insulation of the gradient coil. Each sub-coil 3a, 3b in the diagram of FIG. 2 is represented as a pure self-inductance 47a, 47b which is connected in series with an ohmic resistance 49a, 49b, respectively. These resistances represent the resistance of the conductors constituting the gradient coil 3. Each of the sub-coils 3a, 3b comprises a first end 51a, 51b, respectively, and a second end 53a, 53b, respectively. The first ends 51a, 51b are interconnected via the secondary winding 45 of the transformer 41 and the second ends 53a, 53b are interconnected via a capacitor 55. The secondary winding 45 thus constitutes a series resonant circuit in conjunction with the gradient coil 3 and the capacitor 55. In conjunction with the capacitor 55, the transformer 41 constitutes the matching circuit 11 diagrammatically shown in FIG. 1.

A voltage boost occurs in the described resonant circuit, so that the voltage across the gradient coil 3 is substantially higher than the output voltage of the gradient amplifier 9. The transformer 41 matches the resonant circuit to the gradient amplifier 9 and is also responsible for an increase of the current through the gradient coil 3. The effective power in the gradient coil 3 increases in proportion to the quality factor Q of the resonant circuit. The gradient amplifier 9 need deliver only the real power in the gradient coil 3 (the power dissipated in the resistances 49a and 49b) and not the much higher reactive power. An amplifier which is suitable for use as a gradient amplifier 9 is capable, for example of delivering an output current of 600 A in the case of an output voltage of 400 V. In a conventional circuit a gradient field of 20 mT/m with a rise time of 0.4 ms can thus be achieved. A known method of improving this performance is the addition of a second amplifier whereby the rise time can be halved. However, this method is comparatively expensive because of the high price of precision amplifiers for high powers. It has been found that a greater improvement can be achieved at substantially lower cost by means of the circuit shown in FIG. 2. The circuit can be realized, for example by means of components having the following properties. The transformer 41 has a primary winding 43 with a self-inductance of 200 μH and a resistance of 10 mΩ, and a secondary winding 45 with a self-inductance of 20 μH and a resistance of 2 mΩ. The coupling factor between the primary and secondary windings is 0.95. The total self-inductance of the gradient coil 3 amounts to 200 μH and the total resistance of this coil is 50 mΩ. The capacitance of the capacitor 55 is 50 μF. The resonance frequency of the resonant circuit is then 1.5 kHz and the Q of this circuit is approximately 38. This configuration enables a gradient field of 60 mT/m to be obtained with a rise time of 0.1 ms when a sinusoidal wave of resonance frequency is generated in the resonant circuit. This corresponds to a current of 1620 A through the gradient coil 3 in the case of a voltage of 3050 V across the coil. The gradient amplifier 9 need not deliver its maximum power in this situation, so that power remains to compensate for further losses in the output circuit. Such further losses may occur because switches are inserted in the output circuit.

Figure 3:
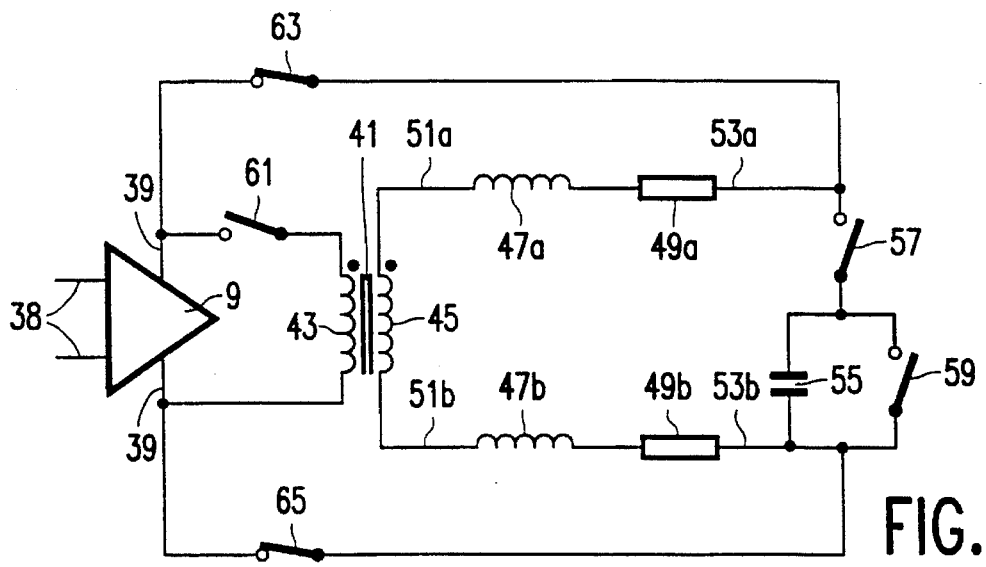
FIG. 3 shows a second embodiment of a circuit for feeding a gradient coil, which embodiment is suitable for use in the apparatus shown in FIG. 1.

FIG. 3 shows a diagram of an embodiment of an output circuit in which switches are inserted. The circuit corresponds substantially to the circuit shown in FIG. 2 and corresponding elements are denoted by corresponding reference numerals. In addition to the elements known from FIG. 2, the circuit also comprises a number of on/off switches which are represented by the customary symbol for a switch in the diagram. In reality, however, semiconductor switches are preferably used for the switches, for example thyristors, GTO thyristors or transistors. Each of the switches comprises a control electrode, not shown in the figure which is connected to the control unit 23 shown in FIG. 1.

A first on/off switch 57 is included in the series resonant circuit and can be opened at an instant at which the current in the resonant circuit equals zero. Evidently, the current then remains equal to zero and the energy in the resonant circuit remains stored in the capacitor 55 until this switch is closed again. The generation of a gradient field can thus be very abruptly terminated. For generating the gradient field it is also possible to charge the capacitor 55 while the first on/off switch 57 is open. At the instant at which this switch is closed, the oscillation in the resonant circuit then commences substantially immediately with the maximum amplitude. A start-up period for starting up the oscillation can thus be avoided. A further application of the first on/off switch 57 will be described in detail hereinafter.

A second on/off switch 59 is connected electrically in parallel with the capacitor 55. When this switch is closed at an instant at which the voltage across the capacitor 55 equals zero, the current in the gradient coil 3 can be maintained at its maximum value for a brief period of time.

A third on/off switch 61 is connected electrically in series with the primary winding 43 of the transformer 41. Furthermore, one of the output terminals 39 of the gradient amplifier 9 is connected, via a fourth on/off switch 63, to one end 53a of the gradient coil 3, its other output terminal 39 being connected, via a fifth on/off switch 65, to another end 53b of said coil. This enables operation of the gradient coil 3 in the resonance mode as well as in the conventional mode. For operation in the resonance mode the first and third on/off switches 57 and 61 are closed and the second, fourth and fifth on/off switches 59, 63 and 65 are opened. It will be evident that a circuit is thus formed which is identical to the circuit shown in FIG. 1. For operation in the conventional mode the first and third on/off switches 57 and 61 are opened and the fourth and fifth on/off switches 63 and 65 are closed. This corresponds to the situation shown in FIG. 3. The state of the second on/off switch 59 is irrelevant in this case. In said position of the switches the output terminals 39 of the gradient amplifier 9 are connected directly to the gradient coil 3 so that a conventional gradient pulse generated by the gradient signal generator 7 can be applied to the gradient coil 3. The secondary winding of the transformer 41, still being connected in series with the gradient coil 3, hardly has any effect because the primary winding 43 is switched off by the third on/off switch 61. In some cases the capacitor 55 will also have a negligibly small effect on the variation of the conventional gradient pulse. In that case the first on/off switch 57 can be dispensed with, unless it is necessary for one of the previously described purposes. The circuit described with reference to FIG. 3 enables the gradient coil 3 to be controlled in the resonance mode and the conventional mode in rapid succession.

Figure 4:
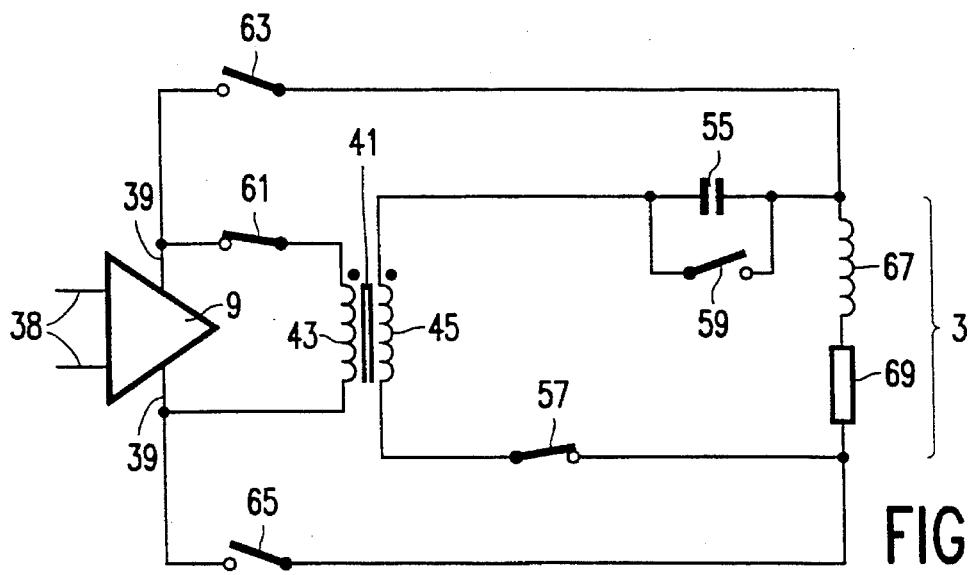
FIG. 4 shows a third embodiment of a circuit for feeding a gradient coil, which embodiment is suitable for use in the apparatus shown in FIG. 1.

FIG. 4 shows a diagram of a circuit which can be used in the apparatus shown in FIG. 1 and in which the gradient coil 3 is constructed as a single coil, i.e. a coil which is not subdivided into sub-coils. The gradient coil 3 in the diagram of FIG. 4 is represented as a combination of a pure self-inductance 67 and an ohmic resistance 69. The further elements of the circuit correspond to the elements of the circuit shown in FIG. 3 and corresponding elements are denoted by corresponding reference numerals. A single gradient coil 3 requires insulation of higher quality than a gradient coil consisting of sub-coils, but in some cases it may still be attractive, for example because it occupies less space in the apparatus. If desired, the capacitor 55 can then be split into two capacitors, each of which connects one end of the secondary winding 45 to one end of the gradient coil 3.

Evidently, alternative versions of the described embodiments are feasible. For example, one or more on/off switches 57, 59, 61, 63, 65 can be dispensed with if their function is not required. If desired, the capacitor 55 may be constructed as a series connection of two or more capacitors, each of which may then be suitable for lower voltages. In many cases it will not be necessary to operate all gradient coils 3 in the resonance mode. In these cases one or two of the matching circuits shown in FIG. 1 may have a construction which is simpler than that of the circuits shown in the FIGS. 2 to 4, or they may even be completely dispensed with.

I claim:

1. A magnetic resonance apparatus, comprising a magnet system (1) for generating a steady magnetic field in a measurement space (35), a gradient coil system (3) for generating gradient fields in the measurement space, and a number of gradient amplifiers (9) with input terminals (38) which are connected to means (7) for generating an input signal exhibiting a predetermined variation as a function of time, and output terminals (39), wherein the output terminals of at least one of the gradient amplifiers is connected to a primary winding (43) of a transformer (41), and a secondary winding (45) of the transformer (41) is included in a series resonany circuit together with a gradient coil (3) and a capacitor (55).

2. A magnetic resonance apparatus as claimed in claim 1, characterized in that the gradient coil (3) is composed of substantially identical first and second sub-coils (3a, 3b), each of which comprises a first end (51a, 51b) and a second end (53a, 53b), and that the first ends (51a, 51b) of the first and second sub-coils are interconnected via the secondary winding (45) whereas the second ends (53a, 53b) of the first and second sub-coils are interconnected via the capacitor (55).

3. A magnetic resonance apparatus as claimed in claim 2, characterized in that a first on/off switch (57) is included in the series resonant circuit.

4. A magnetic resonance apparatus as claimed in claim 2, characterized in that a first on/off switch (59) is connected electrically in parallel with the capacitor (55).

5. A magnetic resonance apparatus as claimed in claim 2, characterized in that a first on/off switch (61) is electrically connected in series with the primary winding (43) of the transformer (41) and that the output terminals (39) of the gradient amplifier (9) are connected to different ends (53a, 53b) of the gradient coil (3), via a second on/off switch (63) and a third on/off switch (65).

6. A magnetic resonance apparatus as claimed in claim 1, characterized in that a first on/off switch (57) is included in the series resonant circuit.

7. A magnetic resonance apparatus as claimed in claim 6, characterized in that a second on/off switch (59) is connected electrically in parallel with the capacitor (55).

8. A magnetic resonance apparatus as claimed in claim 7, characterized in that a third on/off switch (61) is electrically connected in series with the primary winding (43) of the transformer (41) and that the output terminals (39) of the gradient amplifier (9) are connected to different ends (53a, 53b) of the gradient coil (3), via a fourth on/off switch (63) and a fifth on/off switch (65).

9. A magnetic resonance apparatus as claimed in claim 6, characterized in that a second on/off switch (61) is electrically connected in series with the primary winding (43) of the transformer (41) and that the output terminals (39) of the gradient amplifier (9) are connected to different ends (53a, 53b) of the gradient coil (3), via a third on/off switch (63) and a fourth on/off switch (65).

10. A magnetic resonance apparatus as claimed in claim 1 characterized in that a first on/off switch (59) is connected electrically in parallel with the capacitor (55).

11. A magnetic resonance apparatus as claimed in claim 10, characterized in that a second on/off switch (61) is electrically connected in series with the primary winding (43) of the transformer (41) and that the output terminals (39) of the gradient amplifier (9) are connected to different ends (53a, 53b) of the gradient coil (3), via a third on/off switch (63) and a fourth on/off switch (65).

12. A magnetic resonance apparatus as claimed in claim 1 characterized in that a first on/off switch (61) is electrically connected in series with the primary winding (43) of the transformer (41) and that the output terminals (39) of the gradient amplifier (9) are connected to different ends (53a, 53b) of the gradient coil (3), via a second on/off switch (63) and a third on/off switch (65).

\* \* \* \* \*